US 6,681,939 B2

(12) United States Patent
Kuo et al.

(10) Patent No.: US 6,681,939 B2
(45) Date of Patent: Jan. 27, 2004

(54) FIXING DEVICE FOR ATTACHING AN AUXILIARY CARD IN A PERSONAL COMPUTER

(75) Inventors: Yan-Lin Kuo, Taipei Hsien (TW); Chin-Yi Ko, Taipei (TW)

(73) Assignees: Wistron Corporation, Hsi-Chih (TW); Acer Incorporated, Hsi-Chih (TW)

( * ) Notice: Subject to any disclaimer, the term of this patent is extended or adjusted under 35 U.S.C. 154(b) by 0 days.

(21) Appl. No.: 10/063,078

(22) Filed: Mar. 17, 2002

(65) Prior Publication Data

US 2003/0038095 A1 Feb. 27, 2003

(30) Foreign Application Priority Data

Aug. 24, 2001 (TW) .......................... 90120967 A (51) Int. Cl.[7] .............................................. A47G 19/08
(52) U.S. Cl. .................................................. 211/41.17
(58) Field of Search ............................... 211/41.17, 26; 361/683; 312/223.2

(56) References Cited

U.S. PATENT DOCUMENTS

| 5,986,892 | A | * | 11/1999 | Hargy, III ................... 361/759 |
| 6,239,979 | B1 | * | 5/2001 | Ruff ............................ 361/759 |
| 6,320,760 | B1 | * | 11/2001 | Flamm et al. .............. 361/801 |
| 6,515,867 | B2 | * | 2/2003 | Sheng-Hsiung et al. .... 361/759 |

* cited by examiner

Primary Examiner—Alvin Chin-Shue
Assistant Examiner—Sarah Purol
(74) Attorney, Agent, or Firm—Winston Hsu (57) ABSTRACT

A fixing device for attaching an auxiliary card in a personal computer. The fixing device includes a hole formed at each end of a securing module and a main body. The main body includes an elastic portion at a top end of the main body, two arms located at the two ends of the main body, and two engaging portions, one located on each arm. The engaging portions are inserted into the holes at the ends of the securing module, coupling the main body and the securing module, while allowing the main body to partially rotate around the securing module. The elastic portion is used to elastically clamp the auxiliary card in place.

7 Claims, 9 Drawing Sheets

FIXING DEVICE FOR ATTACHING AN AUXILIARY CARD IN A PERSONAL COMPUTER

BACKGROUND OF INVENTION

1. Field of the Invention

The present invention relates to a fixing device, and more specifically, a fixing device for attaching an auxiliary card to a personal computer without using screws.

2. Description of the Prior Art

Personal computers have become part of our daily lives. Hardware devices must be easy to install in a personal computer to satisfy requirements of users. Auxiliary cards, such as display cards or network cards, are the most common add-on hardware devices. The chance of needing to install or detach an auxiliary card is high for most users. The normal procedure for card installation is as follows.

An inner side of a back plate of a personal computer has a securing module having a plurality of fixing slots for securing an auxiliary card, such as a PCI (peripheral component interconnect) card. The auxiliary card comprises a bracket, which is bent to form a flat piece and a vertical piece (i.e., the bracket). The flat piece is positioned onto a securing surface of the securing module and the vertical piece covers the fixing slot when securing the auxiliary card into the computer. The securing surface has a plurality of screw holes, enabling the flat piece to be tightly screwed to the securing surface. Thus the auxiliary card can be tightly held in the computer.

This process achieves the objective of auxiliary card installation. However, a user needs a screwdriver, screws are easily lost, and the process can cause hand injury due to inexperience of the user or difficult angles involved in the card installation process.

SUMMARY OF INVENTION

It is therefore a primary objective of the claimed invention to provide a fixing device for attaching or detaching an auxiliary card in a personal computer without using screws.

The claimed invention, briefly summarized, discloses a fixing device for attaching an auxiliary card in a personal computer. The fixing device includes a first hole formed at one end of a securing module, a second hole formed at another end of the securing module, and a main body. The main body includes an elastic portion at a top of the main body, a first arm and a second arm located at the two sides of the main body, and a first engaging portion located on the first arm and a second engaging portion on the second arm. The first and the second engaging portions are inserted into the first and the second holes at the ends of the securing module, coupling the main body and the securing module, while allowing the main body to partially rotate around the securing module. The elastic portion is used to elastically clamp the auxiliary card in place.

It is an advantage of the claimed invention that a user does not need any tools or screws to secure or detach the auxiliary card in a personal computer, avoiding lost screw bothers and possible hand injury due to inexperience or difficult angles.

These and other objectives and advantages of the claimed invention will no doubt become obvious to those of ordinary skill in the art after reading the following detailed description of the preferred embodiment that is illustrated in the various figures and drawings.

DETAILED DESCRIPTION

Figure 1:
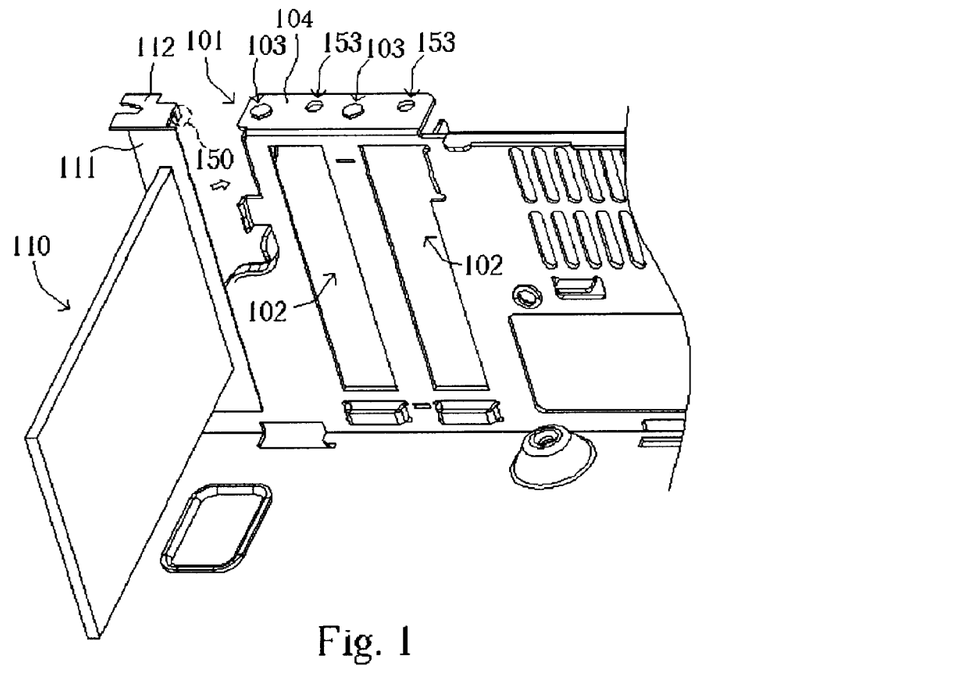
FIG. 1 is a diagram of an auxiliary card positioned into a personal computer according to the present invention.

Please refer to FIG. 1. FIG. 1 is a diagram of an auxiliary card positioned into a personal computer according to the present invention. An inner side of a back plate of a personal computer has a securing module 101 having a plurality of fixing slots 102 for securing an auxiliary card 110, such as a PCI (peripheral component interconnect) card. The auxiliary card 110 comprises a bracket 111 that is bent to form a flat piece 112 and a vertical piece 111 (i.e., the bracket). The flat piece 112 is positioned onto a securing surface 104 of the securing module 101 and the vertical piece 111 covers the fixing slot 102 when securing the auxiliary card 110 into the personal computer. The flat piece 112 has a recess as shown in FIG. 1 and the securing surface 104 has a plurality of positioning poles 103 where prior art screw holes are located. When the flat piece 112 is positioned on the securing surface 104, the recess surrounds the desired positioning pole 103, enabling the flat piece 112 to be tightly connected to securing surface 104. Additionally, the flat piece 112 further comprises a positioning latch 150 for engaging with a positioning hole 153 on the securing surface 104, preventing the flat piece 112 from sliding.

Figure 2A:
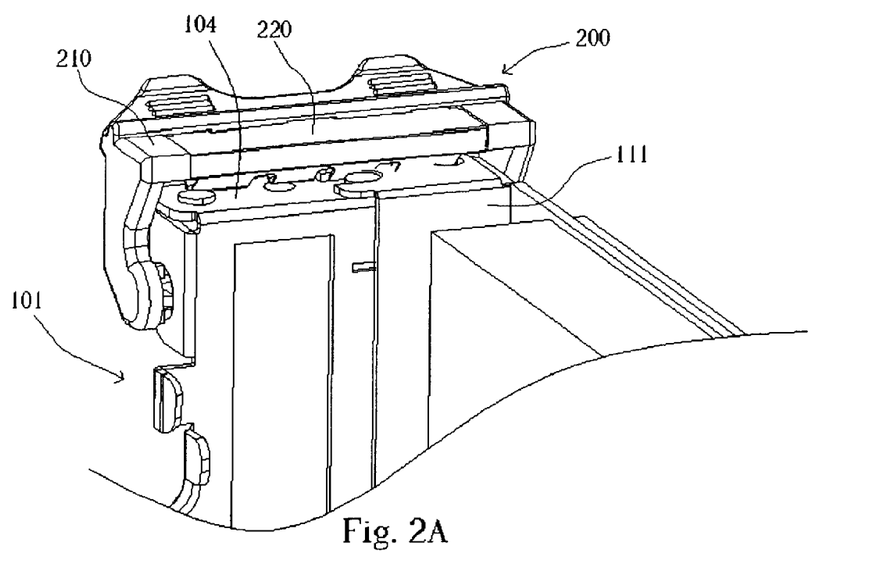
FIG. 2A is a diagram of a fixing device installed onto the personal computer according to the present invention.
Figure 2B:
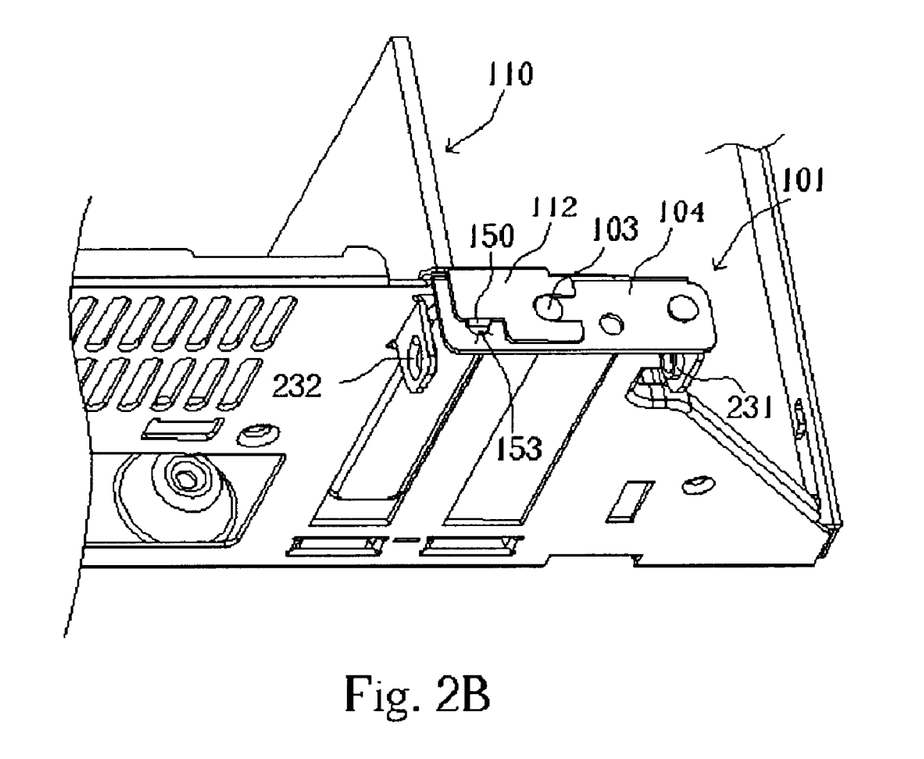
FIG. 2B is a diagram of a securing module collocated with the fixing device depicted in FIG. 2A.

Please refer to FIG. 2A and FIG. 2B. FIG. 2A is a diagram of a fixing device 200 installed into the personal computer according to the present invention. FIG. 2B is a diagram of the securing module 101 collocated with the fixing device 200 depicted in FIG. 2A. As shown in FIG. 2A, the fixing device 200 comprises a main body 210, an elastic portion 220, and two holes positioned at opposing ends of the securing module 101. The elastic portion 220 is positioned above the securing surface 104 for clamping the flat piece 112 so as to secure the auxiliary card 110 (such as a PCI card). Therefore, the flat piece 112 is elastically clamped between the elastic portion 220 and the securing surface 104. The main body 210 thereby maintains a pushed state via elastic force exerted by the elastic portion 220. As shown in FIG. 2B, the securing surface 104 comprises a positioning pole 103, located at the position of a screw hole in the prior art securing module for engaging the recess of the flat piece 112, preventing the flat piece 112 from sliding when attaching to securing surface 104. The two holes 231 and 232 positioned at both sides of the securing module 101 are used to couple the main body 210 with the securing module 101, while allowing the main body 210 to partially rotate around securing module 101.

Figure 3A:
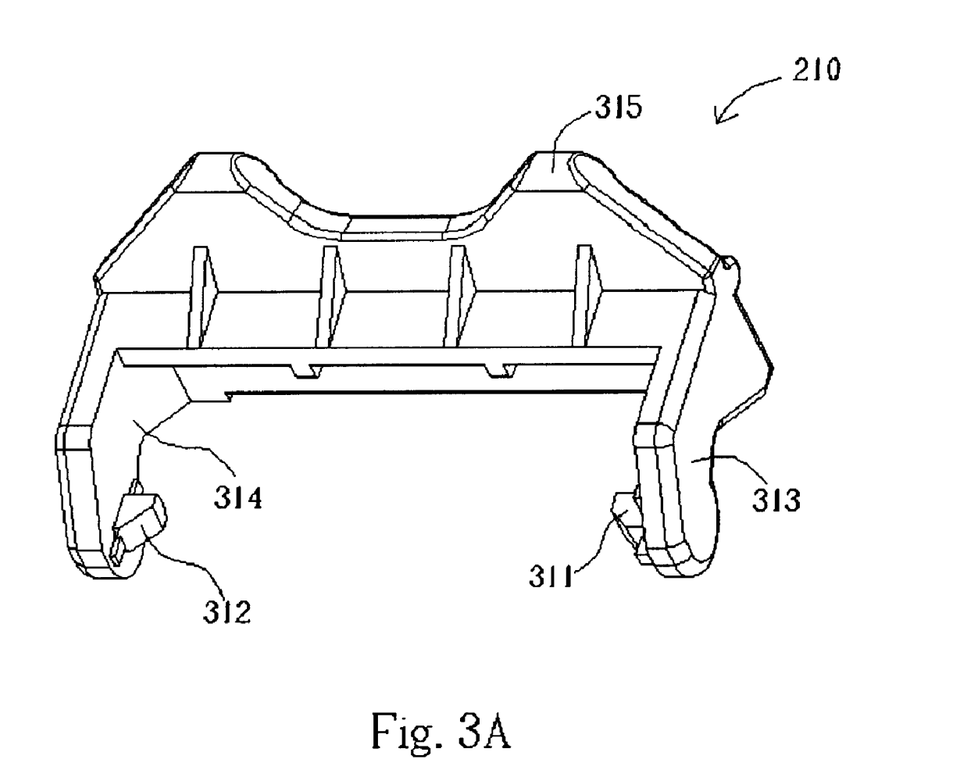
FIG. 3A is a perspective view of a main body depicted in FIG. 2A.
Figure 3B:
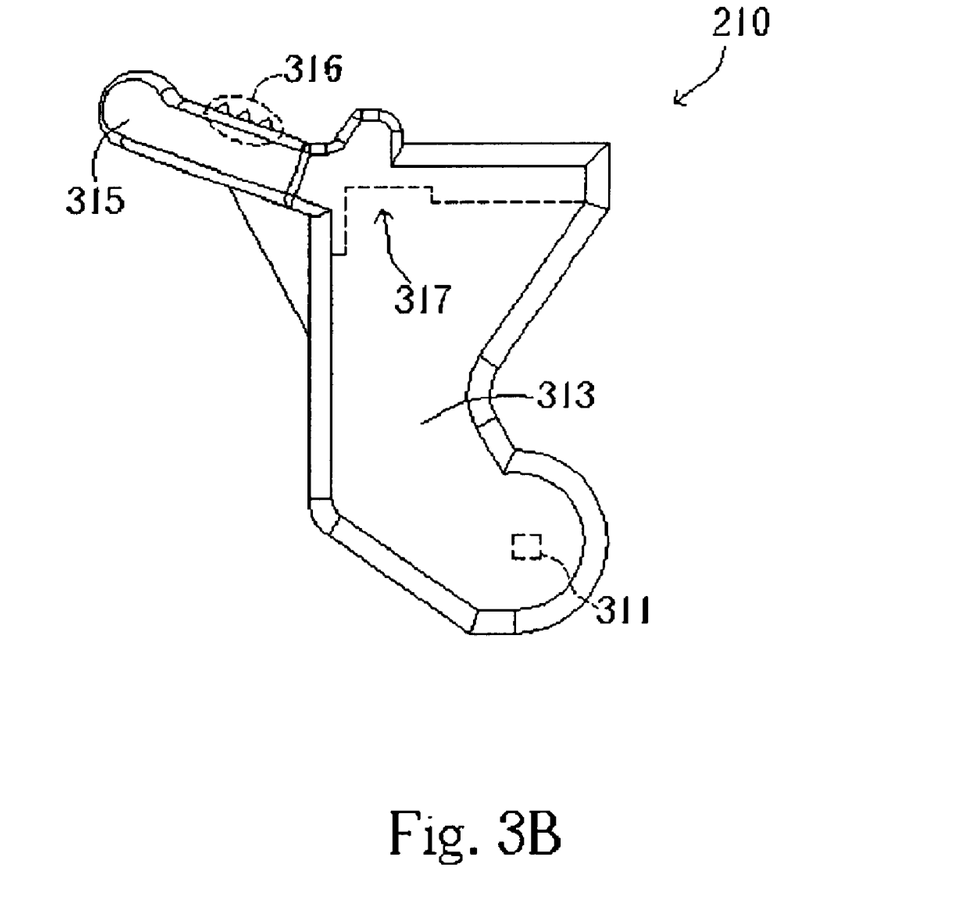
FIG. 3B is a side view of the main body depicted in FIG. 3A.

Please refer to FIG. 3A and FIG. 3B. FIG. 3A is a perspective view of the main body 210 depicted in FIG. 2A. FIG. 3B is a side view of the main body 210 depicted in FIG.

3A. As shown in FIG. 3A, the main body 210 comprises two arms 313 and 314 located at two sides of the main body 210, two engaging portions 311 and 312 located on the two arms 313 and 314, and a handle 315 on the main body 210. The engaging portions 311 and 312 are used to connect with the holes 231 and 232 (FIG. 2B) so that the main body 210 is rotatably coupled to the securing module 101. As shown in FIG. 3B, the main body 210 also comprises a compartment 317 for accommodating the elastic portion 220 when the main body 210 is coupled with the elastic portion 220. The handle 315 has a long supporting arm allowing the user to dismount the main body 210. The handle 315 further comprises a non-slip portion 316 for the user to push, dismounting the main body 210 from the securing module 101 by rotating the main body 210 around the engaging portions 311 and 312 in the direction shown by an arrow.

Figure 4A:
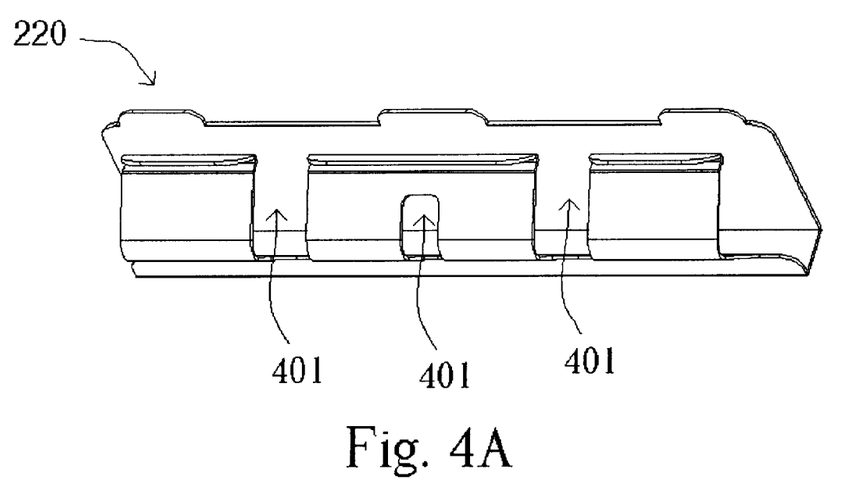
FIG. 4A is a diagram of an elastic portion depicted in FIG. 2A.
Figure 4B:
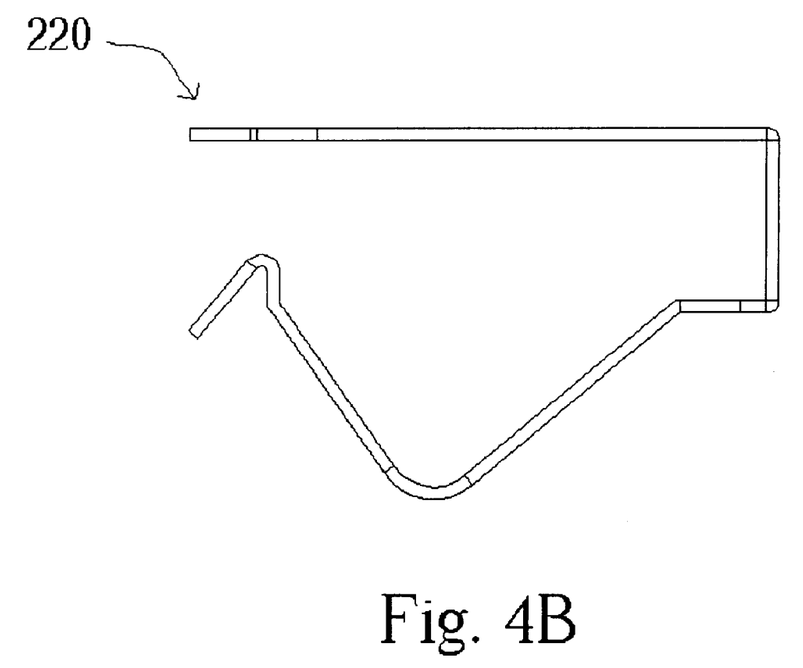
FIG. 4B is a side view of the elastic portion depicted in FIG. 4A.
Figure 4C:
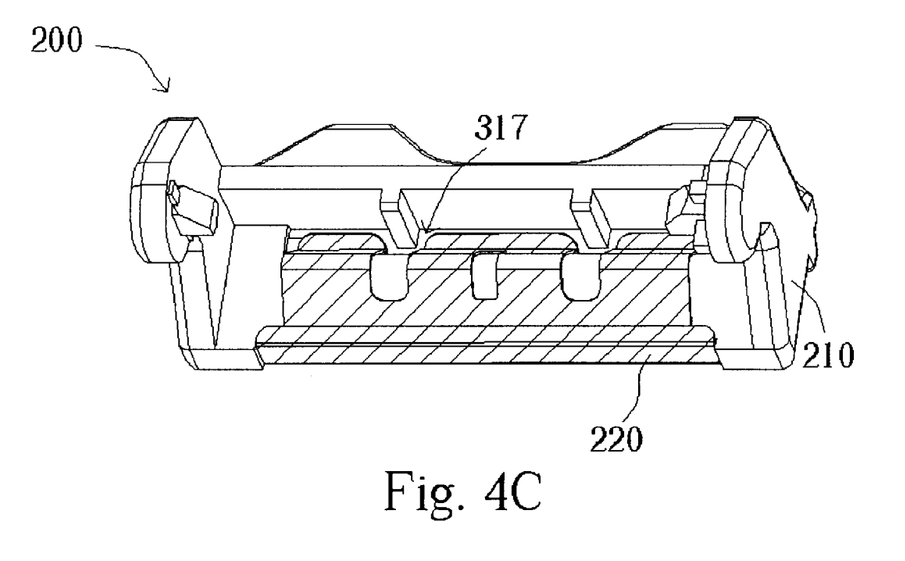
FIG. 4C is a diagram of the elastic portion depicted in FIG. 4A when installed on the main body.

Please refer to FIG. 4A, FIG. 4B and FIG. 4C. FIG. 4A is a diagram of the elastic portion 220 depicted in FIG. 2A. FIG. 4B is a side view of the elastic portion 220 depicted in FIG. 4A. FIG. 4C is a diagram of the elastic portion 220 depicted in FIG. 4A when installed on the main body 210. The elastic portion 220, made of galvanized iron for preventing electromagnetic interference (EMI), comprises a plurality of indentures 401 for increasing elasticity of the elastic portion 220. As shown in FIG. 4B, the elastic portion 220 formed at the top end of the main body 210 is bent to form the shape shown in FIG. 4B and can elastically pressure the auxiliary card 110 and provide the desired elasticity while in the pressurized state. As shown in FIG. 4C, the elastic portion 220 is clamped at the top end of the main body 210, and one end of the elastic portion 220 pushes against the compartment 317. The indentures 401 are designed to increase the elasticity of the elastic portion 220, allowing it to flexibly slide within the compartment 317 when the fixing device 200 is used to anchor the auxiliary card 110 in place.

Figure 5:
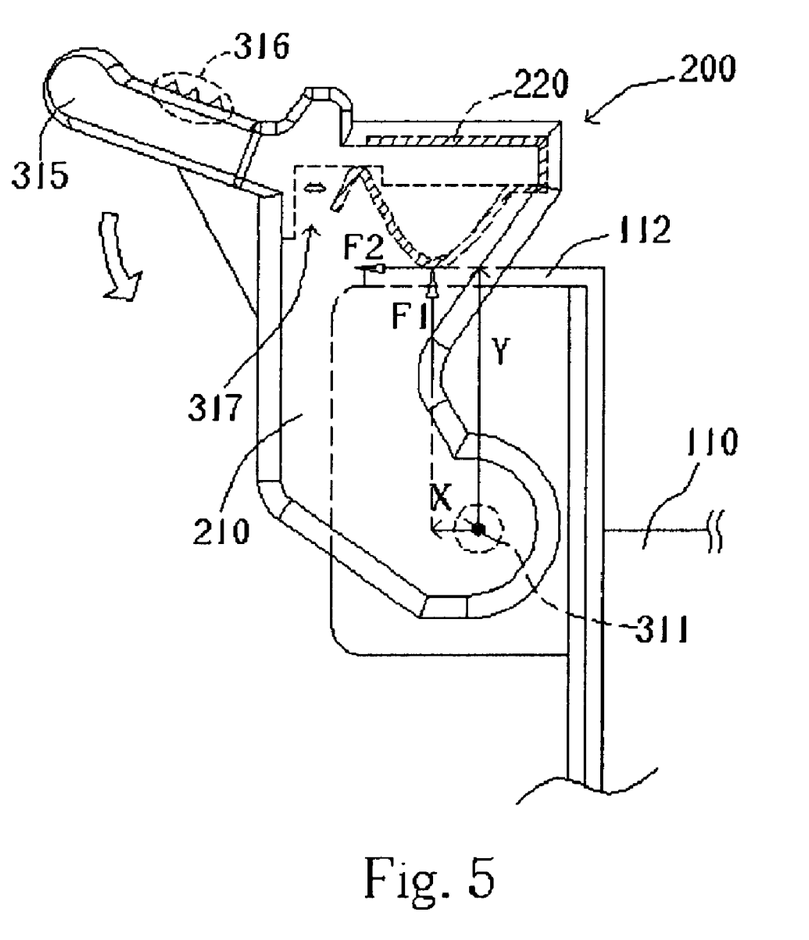
FIG. 5 is a side view of the fixing device depicted in FIG. 2A installed onto the personal computer.

Please refer to FIG. 5. FIG. 5 is a side view of the fixing device 200 depicted in FIG. 2A installed into the personal computer. As shown in FIG. 5, the elastic portion 220 pressures the flat piece 112 to secure the auxiliary card 110 (the flat piece 112 is clamped between the elastic portion 220 and the securing surface 104). A user can press on the non-slip portion 316 of the handle 315 to dismount the main body 210 from the securing module 101. Main body 210 can be rotated around engaging portions 311 and 312 in the direction shown by the arrow, allowing the insertion or removal of one or more auxiliary cards.

When analyzing the mounted state of device 200, the rotating center of the fixing device 200 is located at the center of the engaging portion 311. When the elastic portion 220 pushes against the auxiliary card 110, the fixing device 200 will be exerting two forces F1 and F2, with two action lengths X and Y respectively. The equation is as follows:

$$F1*X=F2*Y$$

Since the length of Y is greater than the length of X, force F1 is greater than force F2. Therefore, when the fixing device 200 is situated in a mounted state, a clockwise torque will be acting on the fixing device 200, preventing the fixing device 200 from dismounting.

In contrast to the prior art, the present invention fixing device does not require a user to use any tools or screws to install or detach an auxiliary card in a personal computer, simplifying the procedure and avoiding lost screw bothers and possible hand injury due to inexperience or difficult angles.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A fixing device for attaching at least one auxiliary card in a personal computer, the personal computer comprising a securing module having at least one fixing slot for securing the auxiliary card, the securing module comprising a securing surface, the fixing device comprising:
    a first hole formed at one end of the securing module;
    a second hole formed at another end of the securing module; and
    a main body coupling with the securing module to form one integrated fixing device, the main body comprising:
        a first arm and a second arm disposed at two sides of the main body;
        a first engaging portion disposed on the first arm for engaging with the first hole, and a second engaging portion disposed on the second arm for engaging with the second hole so that the main body is rotatably coupled to the securing module; and
        an elastic portion formed at a top end of the main body for elastically pushing the auxiliary card.

2. The fixing device of claim 1 wherein the main body further comprises a handle for a user to dismount the main body.

3. The fixing device of claim 1 wherein the main body further comprises a compartment for accommodating the elastic portion when the auxiliary card compresses the elastic portion.

4. The fixing device of claim 1 wherein the elastic portion comprises a plurality of indentures.

5. The fixing device of claim 1 wherein the elastic portion is made of galvanized iron.

6. The fixing device of claim 1 wherein the auxiliary card is a PCI (peripheral component interconnect) card.

7. The fixing device of claim 1 further comprising a positioning pole disposed on the securing surface for preventing the flat piece from sliding.

* * * * *